US008902595B2

(12) United States Patent  
Mukaide

(10) Patent No.: US 8,902,595 B2  
(45) Date of Patent: Dec. 2, 2014

(54) REDUCING POSSIBILITY OF SHORT-CIRCUIT IN A DISPLAY DEVICE

(75) Inventor: Masayoshi Mukaide, Kyoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 315 days.

(21) Appl. No.: 13/492,028

(22) Filed: Jun. 8, 2012

(65) Prior Publication Data

US 2012/0307457 A1  Dec. 6, 2012

Related U.S. Application Data

(63) Continuation-in-part of application No. PCT/JP2010/072004, filed on Dec. 8, 2010.

(30) Foreign Application Priority Data

Dec. 10, 2009  (JP) .................................. 2009-281010

(51) Int. Cl.
  *H05K 5/00*  (2006.01)
  *H05K 5/02*  (2006.01)
(52) U.S. Cl.
  CPC .......................................... *H05K 5/02* (2013.01)
  USPC ............................ 361/733; 361/728; 361/752
(58) Field of Classification Search
  USPC ......... 361/799, 816, 818, 728–733, 752, 800; 174/375, 51, 35 R
  See application file for complete search history.

(56) References Cited

U.S. PATENT DOCUMENTS

| 5,119,204 A * | 6/1992 | Hashimoto et al. ........... 348/794 |
| 7,804,681 B2 * | 9/2010 | Wu et al. .................. 361/679.21 |
| 2008/0080128 A1 * | 4/2008 | Chikazawa et al. ........... 361/683 |
| 2013/0044266 A1 * | 2/2013 | Abe et al. ...................... 348/843 |

FOREIGN PATENT DOCUMENTS

JP  2005-286987  10/2005

* cited by examiner

*Primary Examiner* — Hung S Bui
(74) *Attorney, Agent, or Firm* — McDermott Will & Emery LLP

(57) ABSTRACT

An image display device which is provided with an image display panel, and a housing which houses the image display panel. In the front wall of the housing, an image display window makes the screen of the image display panel viewable from the outside. In the rear wall of the housing are two housing sections, each being configured by connecting together a recessed section provided in the rear wall, and a cover which covers the opening of the recessed section. On the recessed section-side connecting surface from the surfaces on which the recessed section and the cover of each housing section are connected, screw members are screwed at a plurality of areas along the inner circumference of the connecting surface by penetrating the cover. The distances between the adjacent screw members in the two housing sections are different from each other.

1 Claim, 6 Drawing Sheets

F I G. 5
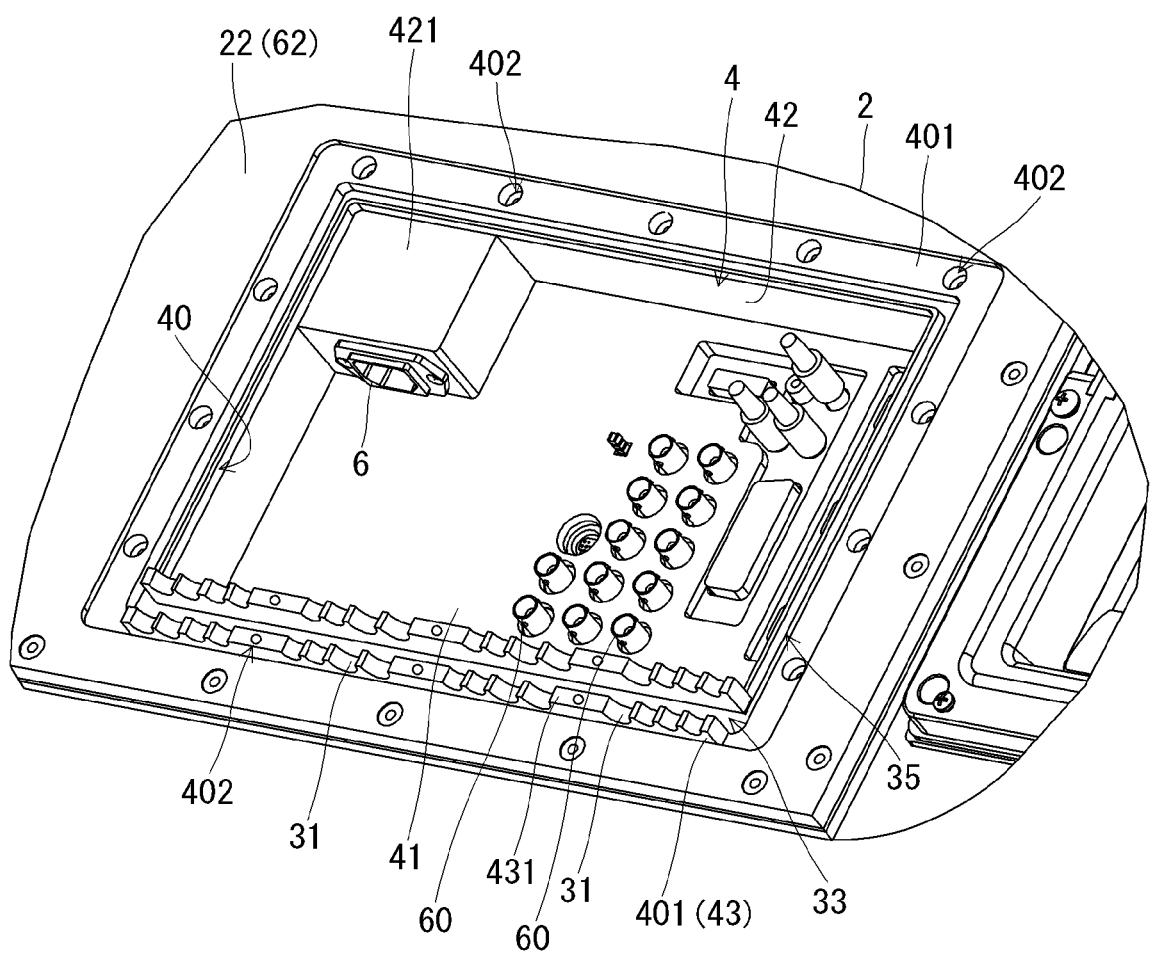

REDUCING POSSIBILITY OF SHORT-CIRCUIT IN A DISPLAY DEVICE

CROSS-REFERENCE TO RELATED APPLICATIONS

This application is a continuation-in-part application of Patent Cooperation Treaty Patent Application Number PCT/JP2010/072004 (filed on Dec. 8, 2010), which claims priority from Japanese patent application JP 2009-281010 (filed on Dec. 10, 2009), all of which are hereby incorporated by reference herein in their entirety.

TECHNICAL FIELD

The instant application relates to reducing possibility of short-circuit in a display device.

BACKGROUND

The display device may include a display panel and a cabinet for accommodating the display panel. In usage, the display device may be placed on a wall of an indoor room by fixing the backside of the cabinet to the wall. Alternatively, the display device may be standalone display device. See e.g., JP2005-286987A1.

The display device may also include a socket configured to receive a power supply cord for supplying an electric power to the display panel and a connector configured to receive a cable for receiving and/or transmitting image and audio signals. The socket and/or cable may be arranged in the rear wall of the cabinet, facing toward the back side.

As long as the display device is installed indoor, the socket and/or connector may not get exposed to water or dust, and therefore they may be configured such that they are exposed from the back of the cabinet. In recent years, it is expected to install such display device outdoors since the display device may have a small thickness. The small thickness may be advantageous for installing the display device in narrow locations, for example.

However, in the outdoor-use display devices, if the socket or plug is exposed from the back side of the cabinet, the socket or plug may get exposed to water or dust, resulting in a short-circuit or fire from the circuit. To prevent such short-circuit or fire, one idea is to utilize a dedicated cord having a sealed structure in order to protect the plug and the socket from the dust and water. Such dedicated cord is expensive, however, and increases the manufacturing cost of the display device. Another idea is to form a sealing structure in an accommodation unit, which accommodates the socket and the connector. The sealing structure may be formed by jointing the concave portion provided on the back wall of the cabinet and a lid which covers the opening of this concave portion. The sealing structure may protect a socket and a connector from water or dust. However, such sealing structure may reduce operating convenience because the lid may have to be frequently removed to connect or disconnect the cable to the connector.

Accordingly, there is a need for a display device that can reduce or eliminate short-circuit or fire in the display device installed outdoors while preventing an increase in manufacturing cost and decrease operating convenience.

SUMMARY

In one general aspect, the instant application describes a display apparatus that includes a display panel; a cabinet configured to accommodates the display panel; a first concave portion defining a first opening in a back wall of the cabinet; a first lid configured to cover the first opening; a second concave portion defining a second opening in the back wall of the cabinet; a second lid configured to cover the second opening; a plurality of first fastening elements configured to connect the first concave portion and the first lid; and a plurality of second fastening elements configured to connect the second concave portion and the second lid. A distance between adjacent first fastening elements and a distance between adjacent second fastening elements are different.

In the above general aspect, the second concave portion may be provided on the first lid.

BRIEF DESCRIPTION OF DRAWINGS

FIG. 5 is an enlarged perspective view of a second concave portion which forms a second accommodation unit provided in the exemplary display device shown in FIG. 1;

DETAILED DESCRIPTION

In the following detailed description, numerous specific details are set forth by way of examples in order to provide a thorough understanding of the relevant teachings. However, it should be apparent to those skilled in the art that the present teachings may be practiced without exemplary details. In other instances, well known methods, procedures, components, and/or circuitry have been described at a relatively high-level, without detail, in order to avoid unnecessarily obscuring aspects of the present concepts.

Figure 1:
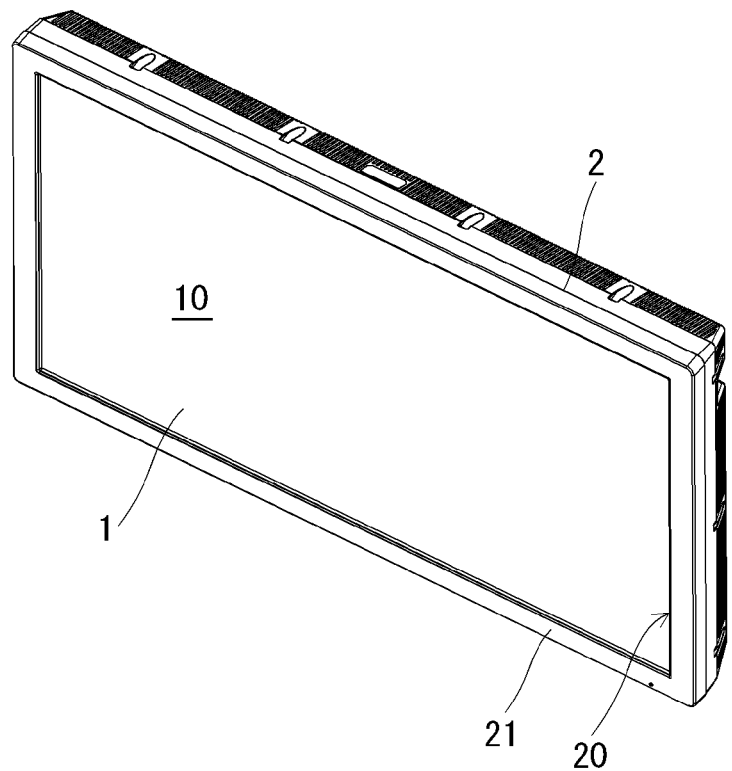
FIG. 1 is a perspective view showing an exemplary display device of the instant application.

FIG. 1 is a perspective view showing an exemplary display device of the instant application. The display device includes a LCD (Liquid Crystal Display) panel (1) and a cabinet (2) for accommodating the panel (1). In the front wall (21) of the cabinet (2), a display window (20) is provided so as to make a screen (10) of the panel (1) viewable from the outside.

Figure 2:
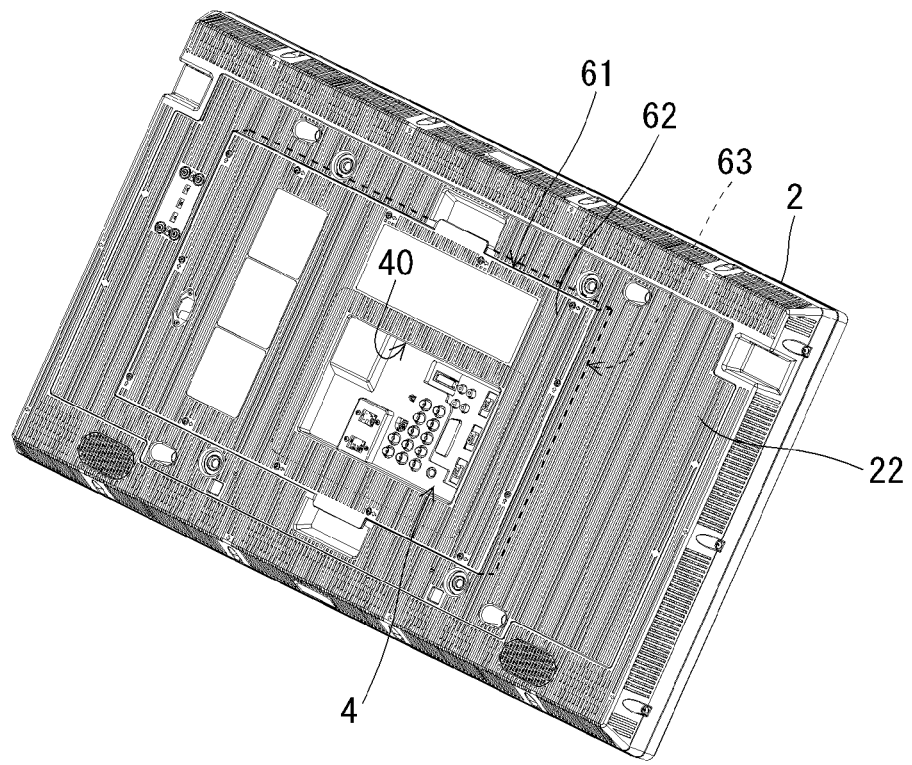
FIG. 2 is a perspective view of the exemplary display device shown in FIG. 1 when viewed from its back side.

FIG. 2 is a perspective view of the exemplary display device shown in FIG. 1 when viewed from its back side. As shown in FIG. 2, a first concave portion (61) is provided in the back wall (22) of the cabinet (2). The first concave portion (61) has a rectangular shaped opening having four sides. The opening of the first concave portion (61) is covered by a first lid (62), which is a portion of the back wall (22), and in this state, the lid (62) is jointed to the first concave portion (61).

Specifically, the first concave portion (61) has four edges surrounding the opening of the first concave portion (61). The first lid (62) has a rectangular shape with four sides. The rectangular shape of the first lid (62) may be substantially same as the perimeter edge of the edge surrounding the opening of the first concave portion (61). By covering the opening with the first lid (62), the surface of the edge portion of the first concave portion (61) contacts the back side of the first lid (62). In this state, the first concave portion (61) may be connected to the first lid (62) by, for example, screwing the first lid (62) to the edge of the first concave portion (61).

Figure 3:
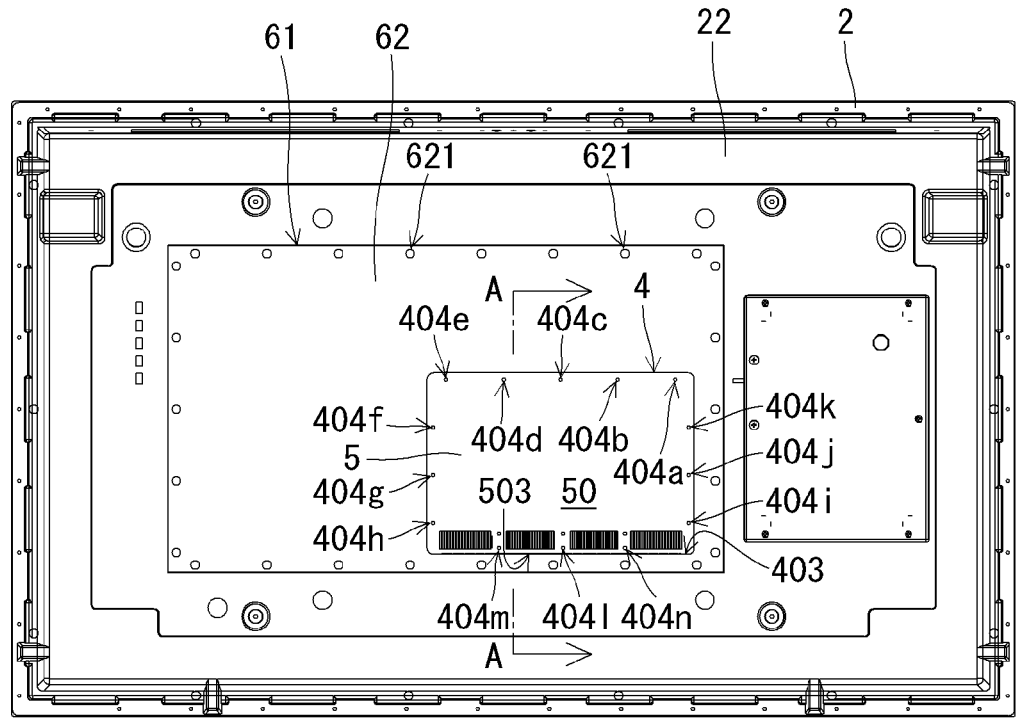
FIG. 3 is a rear view of the exemplary display device shown in FIG. 1.
Figure 4:
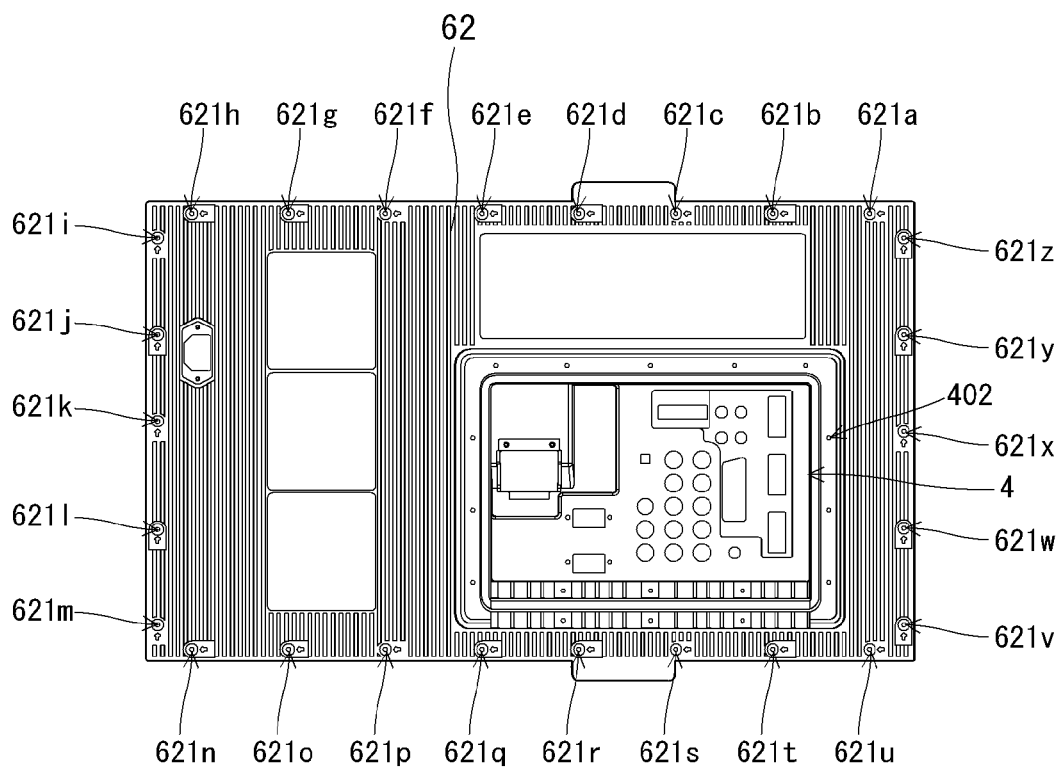
FIG. 4 is a plan view showing a first lid which forms a first accommodation unit provided in the exemplary display device shown in FIG. 1.

Thereby, as shown in FIG. 2, in the back wall (22) of a cabinet (2), a first accommodation unit (63) constituted by jointing the first lid (62) and the first concave portion (61) is formed. Among the back side of the first lid (62), the jointing surface of the first lid (62) is formed by an area which contacts edges of the first concave portion (61). In order to connect the first lid (62) to the edges of the first concave portion (61), a screw component may be utilized To this end, as shown in FIG. 3, in the first lid (62) plurality of penetration holes (621) are provided. The plurality of penetration holes may be configured to receive the screw components. Specifically, as shown in FIG. 4, in the edges of the first lid (62), eight penetration holes (621a)-(621h) are formed aligned in the portion along the upper side from the right side to the left side. Five penetration holes (621i)-(621 m) are formed aligned in the portion along the left side from the top to the bottom. Eight penetration holes (621n)-(621u) are formed aligned in the portion along the lower side from the left to the right. Five penetration holes (621v)-(621z) are formed aligned in the portion along the right side from the bottom to the top.

Among the jointing surfaces of the first concave portion (61) and the first lid (62), in the concave portion (61) side jointing surface, screw holes may be provided in a plurality of places along the inner edge of the jointing surface. Each of the screw holes may be arranged in the position that faces the corresponding penetration holes (621), when the opening of the first concave portion (61) is covered by the first lid (62). In one implementation, when joining the first lid (62) to the first concave portion (61), a plurality of penetration holes (621) are selected for penetrating a screw component among holes (621a)-(621z). In each of the selected holes (621), a screw component is penetrated, and the screw component is screwed to the corresponding screw holes. Thereby, the first lid (62) is screwed to the edge of the first concave portion (61).

Between the jointing surface of the first concave portion (61) of the first accommodation unit (63) and the first lid (62), a seal component which surrounds the space inside the accommodation unit (63) may be placed. The sealing component may prevent or reduce intrusion of the water and dust inside the first accommodation unit (63) from between the jointing surfaces of the first lid (62) and the first concave portion (61). Hence, the first accommodation unit (63) has a sealed structure which prevents or reduces the intrusion of water or dust inside the first accommodation unit (63). In the first accommodation unit (63), a circuit board for controlling the LCD panel (1) is accommodated, for example.

In one implementation, the jointing strength between the first concave portion (61) and the first lid (62) may be increased by making distance between the neighboring screw components small. To this end, the sealing performance of the first accommodation unit (63) may be improved. In one specific example, when a relatively high sealing performance equivalent to IP66 (here, IP is a code indicating the degrees of protection provided by enclosures in the IEC 60529 of an IEC (International Electro-technical Commission) standard) is required in the first accommodation unit (63), the screw components may be penetrated into all or substantially all of the penetration holes (621a)-(621z), and the screw components may be screwed to the screw holes provided in the first concave portion (61) side of the jointing surface. As a result, the distance between the adjacent screw components becomes small.

In another example, when a higher sealing performance equivalent to IP 33 in the IEC standard is used, the screw components may be penetrated into less than all the penetration holes (621a)-(621z). To this end, the distance between the neighboring screw components can be set larger compared with the case of IP 66. In one specific example, the screw components are inserted only in the penetration holes (621a) (621c) (621f) (621i) (621k) (621n) (621p) (621s) (621u) (621x) (621z) out of the penetration holes (621a)-(621z). As for rest of the penetration holes, in which the screw components are not inserted, they are covered by the sealing component. Widening the distance between the screw components can reduce the number of the screw components necessary for joining the first lid (62) and the first concave portion (61). As a result, it becomes easier to remove the first lid (62) from the first concave portion (61). In one implementation, the screw components are waterproofing screws which can be expensive. Therefore, reducing the number of the screw components can help in reducing the manufacturing cost.

The first lid (62) of the first accommodation unit (63) may be seldom removed except for repairing circuit board accommodated in the first accommodation unit (63) or for maintenance. Thus, it may not be necessary to remove the first lid (62) of the first accommodation unit (63) frequently. As a result, even when the required sealing level is IP33, the screw components may be inserted in all of the penetration holes (621a)-(621z) provided on the first lid (62).

Since the first lid (62) may be seldom removed, the screw components of the first accommodation unit (63) can be screwed with a large torque to the screw hole provided on the first concave portion (61) side so that the jointing strength between the first concave portion (61) and the first lid (62) may be increased. Thereby, high sealing performance in the first accommodation unit (63) may be realized.

As shown in FIG. 2, in the back wall (22) of the cabinet (2), a second concave portion (4) is provided. The second concave portion (4) is provided on the first lid (62) which constitutes the first accommodation unit (63). The second concave portion (4) is substantially rectangular and includes an opening (40) having four sides. As shown in FIG. 5, a plurality of connectors (60) configured to receive cables for receiving or transmitting video or audio signal is attached in the bottom wall (41) of the second concave portion (4) facing backward.

In the upper wall (42) of the second concave portion (4), a socket (6) for inserting a plug (71) (see FIG. 9) of a power cord (7) is attached facing downward. The power cord (7) is configured to supply power to the LCD panel (1) is attached. In detail, in the upper wall (42), a rectangular shaped mounting unit (421) for attaching the socket (6) is formed. The socket (6) is attached downward to the lower wall of the unit (421) so as to penetrate the lower wall, as shown in FIG. 6.

Figure 6:
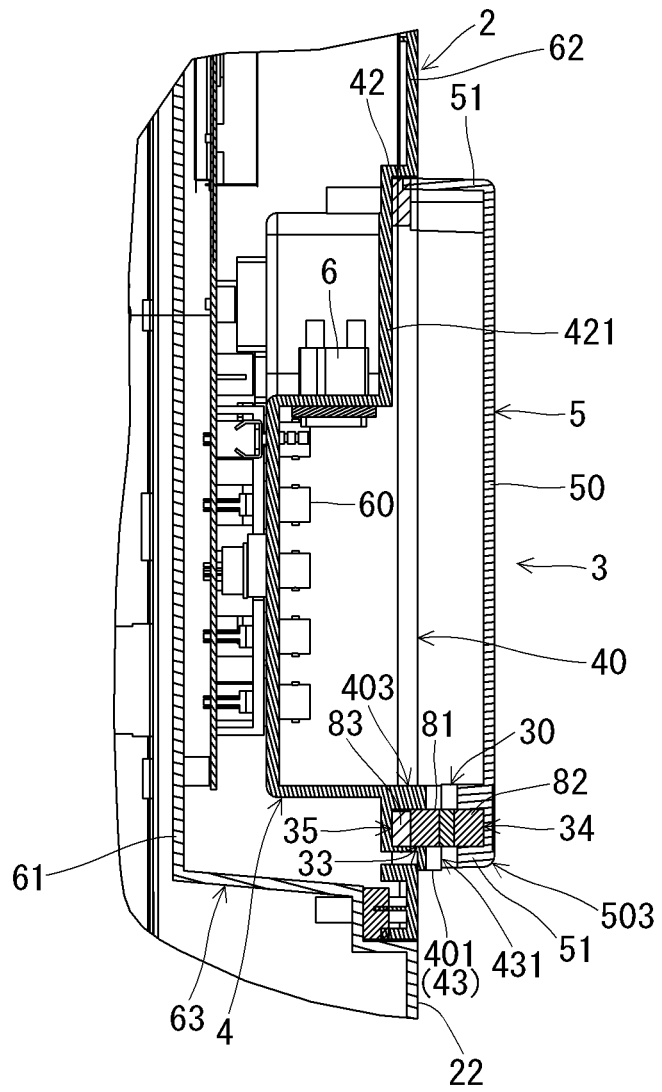
FIG. 6 is a sectional view along the A-A line shown in FIG. 3.
Figure 7:
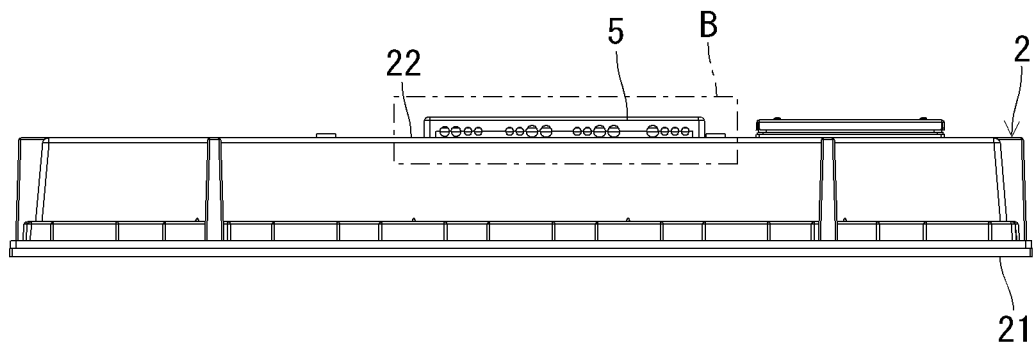
FIG. 7 is a bottom view of the exemplary display device shown in FIG. 1.

As shown in FIG. 6, the opening (40) of the second concave portion (4) is covered by a second lid (5) which is jointed to the second concave portion (4). In detail, as shown in the FIG. 5, the second concave portion (4) has an edge portion (401) stretching along the four sides of the opening (40) of the second concave portion (4) such that the edge portion (401)

surrounds the opening (40). The second lid (5) has a board (50), having four sides and substantially rectangular shape as shown in FIG. 3.

The second lid (5) also includes four side walls (51). The four side walls (51) extend from the four sides of the board (50) and are substantially perpendicular to the board (50) as shown in FIG. 6. By covering the opening (40) of the second concave portion (4) by the second lid (5), forefront surface of the side walls (51) of the second panel (5) contacts the edge portion (401). Under this condition, by screwing the second lid (5) to the edge portion (401) of the second concave portion (4), the second lid (5) connects to the second concave portion (4).

As shown in FIG. 6, in the back wall (22) of the cabinet (2), a second accommodation unit (3) constituted by jointing the second concave portion (4) and the second lid (5) is formed. In the accommodation unit (3), a connector (60) and a socket (6) are accommodated. The jointing surface of the second concave portion (4) and the second lid (5) is formed by edge portion (401) of the second concave portion (4) and forefront surface of the side walls (51) of the second lid (5) which contacts the edge portion (401).

The cable may be connected to or removed from the connector (60) frequently. Thus, the second lid (5) of the second accommodation unit (3) may have to be removed frequently. However, when relatively high sealing performance such as equivalent to IP66 is required in the second accommodation unit (3), it may not be so desirable to harm the sealing structure in the second accommodation unit (3) even temporarily. Thus, it may be preferable to limit the frequency of removing the second lid (5) in such case.

As for connecting the second lid (5) to the edge portion (401) of the second concave portion (4), screw components may be used. Here, as shown in FIG. 3, a plurality of penetration holes (404) configured for receiving the screw components are provided on the second lid (5). In one specific example, as shown, five penetration holes (404a)-(404e) are formed along the upper side portion of the edge of the second lid (5) from the right to the left. Three penetration holes (404f)-(404h) are formed along the left side of the second lid (5) from the top to the bottom. Three penetration holes (404i)-(404k) are formed along the right side of the second lid (5) from the bottom to the top. In the center part of the lower side of the second lid (5), a pair of penetration holes (404l) is provided in a vertical (up and down) direction. In the left side of the holes (404l), a pair of penetration holes (404m) is provided in vertical direction, and in the right side of the holes (404l), a pair of penetration holes (404n) is provided in vertical direction.

As shown in FIG. 5, among the jointing surface of the second concave portion (4) and the second lid (5), in the second concave portion (4) side, screw holes (402) are provided on the plurality of places along the edge portion (401) of the second concave portion (4)). Each of the screw holes (402) may be located on the position where it faces the corresponding penetrating holes (404) when the opening (40) is covered by the second lid (5).

When connecting the second lid (5) with the second concave portion (4), the plurality of penetration holes (404) for penetrating the screw components may be selected among the holes (404a)-(404n) provided in the second lid (5). In the selected penetrating hole (404), a screw component may be inserted, and the screw component may be screwed to a screw hole (402) corresponding to the penetrating hole (404). Thereby, the second lid (5) is fixed to the edge portion (401) of the second concave portion (4).

Figure 8:
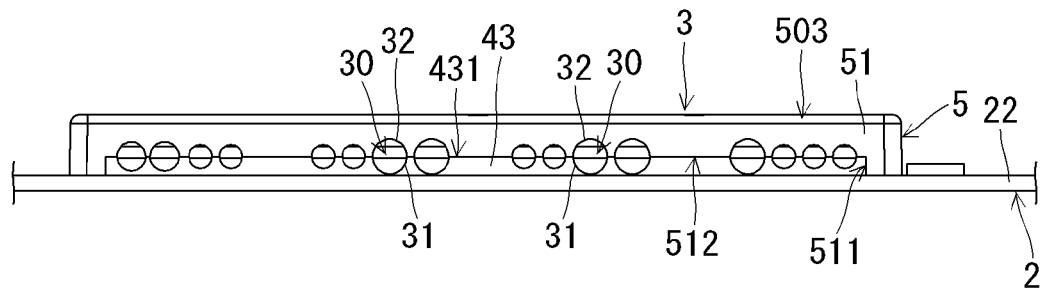
FIG. 8 is an enlarged view of the B area shown in FIG. 7.

Here, as shown in FIGS. 3, 5, and 6, the edge portion (401) of the second concave portion (4) protrudes backward from the back wall (22) of the cabinet (2) in the area along the lower side (403), which is one of the four sides of the opening (40) of the second concave portion (4), thereby, forming the protruding portion (43) is formed. As shown in FIG. 8, among the four side walls (51) of the second lid (5), the side wall (51) extending along the lower side (503) (see FIG. 3 or 6 also) of the top plate (50) includes a concave portion (511). The concave portion (511) conforms to the shape of the portion (43) and is configured to receive the protruding portion (43). To this end, when the second concave portion (4) and the second lid (5) are jointed, the tip side (431) of the protruding portion (43) contacts the bottom surface (512) of the concave portion (511). Thereby, among the second accommodation unit (3), the second lid (5) and the protruding portion (43) protrudes backward from the back wall (22) of the cabinet (2).

Figure 9:
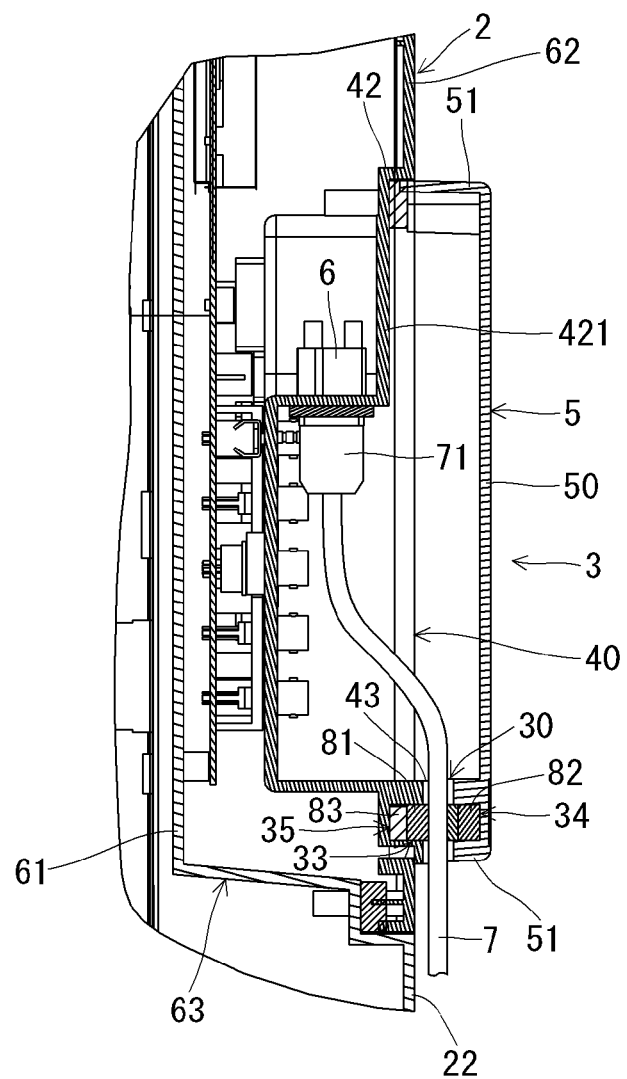
FIG. 9 is a sectional view showing the state where a plug of a power cord is inserted to the socket provided in the exemplary display device shown in FIG. 1.

As shown in FIG. 8, among the jointing surface of the second concave portion (4) and the second lid (5), in the jointing surface of the protruding portion (43) and the side wall portion (51), a plurality of pair of concave grooves (31) and (32) is formed. Specifically, the plurality of pair of concave grooves (31) and (32) are formed in the forefront surface (431) of the portion (43) and in the bottom surface (512) of the portion (511), respectively. Among each of the pair of the grooves (31) and (32), groove (31) faces groove (32) in a state the second concave portion (4) and the second lid (5) are jointed, thereby forming a penetrating hole (30). The penetrating hole (30) enables communication from the inside of the second accommodation unit (3) to the outside of the second accommodation unit (3) and vice versa. In the penetrating hole (30), the power cord (7) or the cables may be penetrated as shown in FIG. 9.

Thereby, in the above-described display device, in the lower surface wall of the second accommodation unit (3), the penetration hole (30) for penetrating a power cord (7) or a cable is formed in the area outside the area intersecting the back wall (22) of the cabinet (2).

Figure 11:
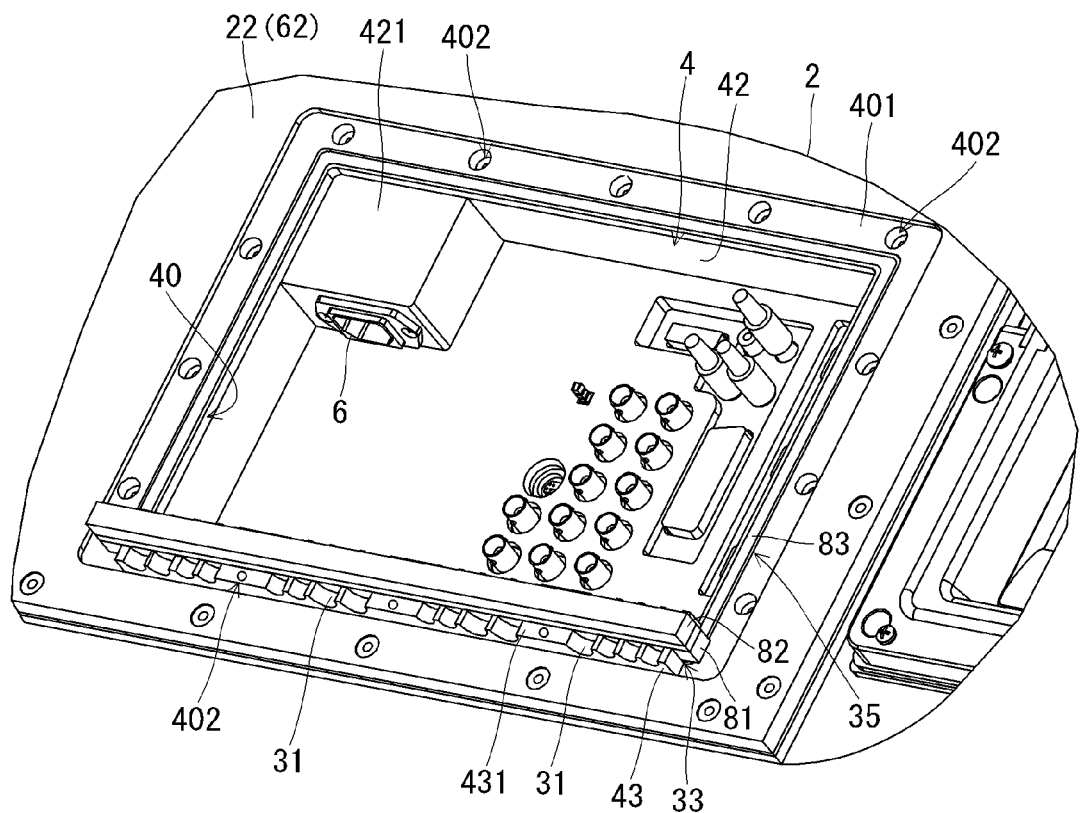
FIG. 11 is another perspective view showing a seal structure associated with a second accommodation unit of the exemplary display device shown in FIG. 1.

As shown in FIG. 5, among the jointing surface of the protruding portion (43) and the side wall portion (51), in the forefront surface (431) of the portion (43), a second concave groove (33) crossing the plurality of grooves (31) is formed (see also FIG. 6). As shown in FIGS. 6 and 11, the first sealing component (81) is fitted to the second concave groove (33). Similarly, as shown in FIG. 6, in the bottom surface (512) of the portion (511) of the side wall (51), a second concave groove (34) crossing the plurality of grooves (32) is formed. To the second concave groove (34), a second sealing component (82) is fitted. The second sealing component (82) is different from the first sealing component (81) fitted to the second concave groove (33) in the portion (43).

The seal components (81) and (82) contact each other when the second concave portion (4) and the second lid (5) are jointed. Thus, the penetrating hole (30) formed by jointing the second concave portion (4) and the second lid (5) is covered by the seal components (81) and (82) as shown in FIG. 6. As a result, intrusion of the water or dust from the hole (30) into the second accommodation unit (3) is prevented by the seal components (81) and (82).

Figure 10:
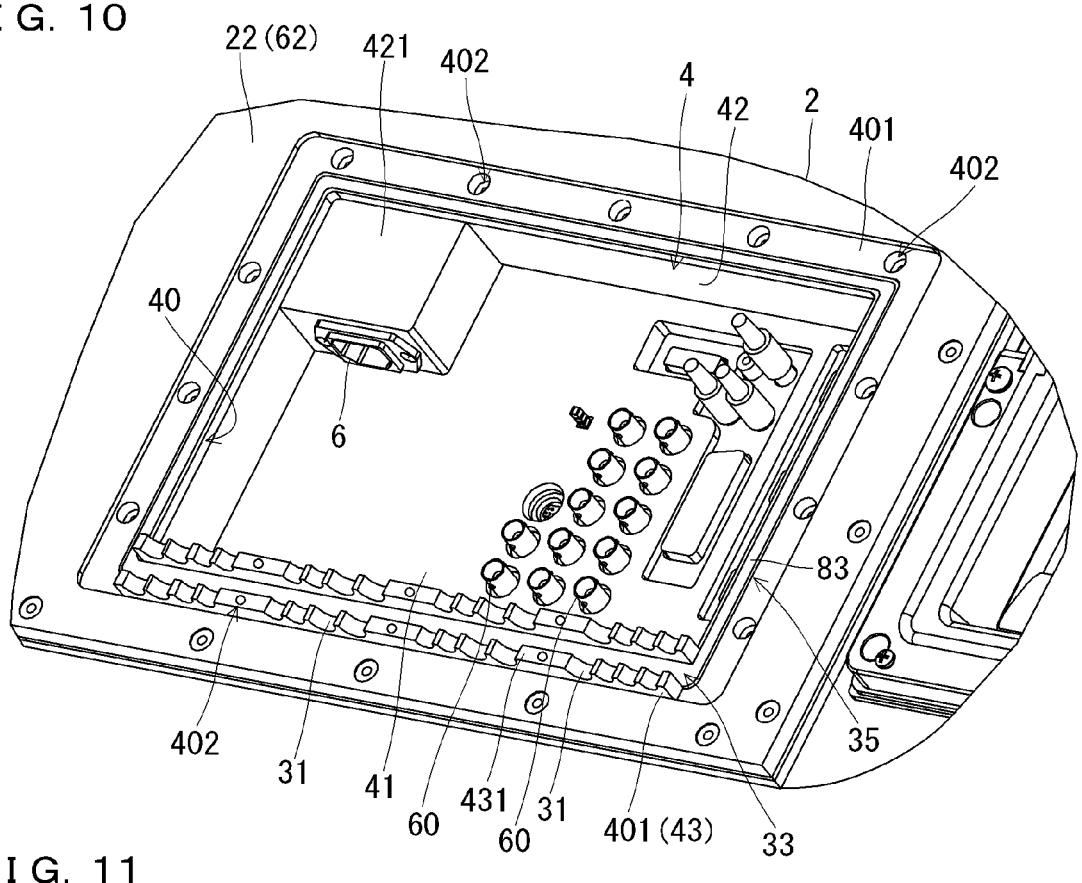
FIG. 10 is a perspective view showing a seal structure associated with a second accommodation unit of the exemplary display device shown in FIG. 1.

As shown in FIG. 5, in the edge portion (401) of the second concave portion (4), a third groove (35) surrounding the space inside the second accommodation unit (3) is formed so as to overlap the second groove (33) in a concave manner. To this third groove (35), a ring shaped third sealing component (83) is fitted as shown in FIG. 10.

In detail, the third groove (35) is formed along the four sides of the opening (40) of the second concave portion (4)

which contacts the four side walls (51) of the second lid (5) when the second lid (5) is jointed to the second concave portion (4). The third groove (35) has a smaller width in the upper side, left side, and/or the right side of the opening (40) of the second concave portion (4) than the width of the second groove (33) in the bottom side of the opening (40). The third sealing component (83) contacts the first sealing component (81) in a portion along the bottom side (403) out of the four sides of the opening (40) when the second concave portion (4) and the second lid (5) are jointed. At the same time, the third sealing component (83) contacts the upper side, left side, and/or right side of the side walls (51) of the second lid (5). Thereby, intrusion of water and/or dust between the jointing surfaces may be prevented by the third sealing component (83).

Here, the jointing strength between the second concave portion (4) of the second accommodation unit (3) and the second lid (5) may be increased by making the distance between adjacent screw components arranged in the circumference of the second accommodation unit (3) small. As a result, the sealing performance in the second accommodation unit (3) may be improved. When a relatively high sealing performance IP66 is required in the second accommodation unit (3), the screw components may be penetrated in all the penetration holes (404a)-(404n) provided in the plurality of places in the second lid (5).

The screw components may be screwed to the screw holes (402) provided on the edge portion (401) of the second concave portion (4). When a relatively high sealing performance is required, the screw components of the second accommodation unit (3) may be screwed with large torque to the screw holes (402) provided on the edge portion (401) of the second concave portion (4). By penetrating screw components in all of the penetration holes (404a)-(404n) and screwing the screw components by large torque, although the removal of the second lid (5) may become difficult, seal structure may be deteriorated.

When the required sealing performance level for the second accommodation unit (3) is IP33, compared with the case of IP66, the distance between the adjacent screw components may be made larger. In such case, out of the penetration holes (404a)-(404n) provided in plurality of places in the second lid (5), the screw components may be penetrated in three of the holes (404c), (404g), and (404j) along the top, left, and right sides of the second lid (5) respectively and in a pair of the holes (404l) along the bottom side of the second lid (5). These screw components are screwed to the screw holes (402) provided on the edge portion (401) of the second concave portion (4). Furthermore, the remaining penetration holes, in which the screw components are not penetrated, may be covered by seal materials. In this case, distances between the adjacent screw components are different between two accommodation units (63) and (3).

Specifically, the distance becomes larger in the second accommodation unit (3) compared to that in the first accommodation unit (63). When this distance becomes larger in the second accommodation unit (3), the number of the utilized screw components decreases. Therefore, it may become easier to remove the second lid (5) in the second accommodation unit (3), where the distance between the adjacent screw components is large, compared to the first lid (62) in the first accommodation unit (63), where the distance between the adjacent screw components is small. Furthermore, in case of IP33, the screw components of the second accommodation unit (3) may be screwed to the screw holes (402) with a smaller torque, when compared with the case in the first accommodation unit (63). This may further enhance ease of removal of the second lid (5) in the second accommodation unit (3) compared to the first lid (62) in the first accommodation unit (63).

If the torque for screwing the screw components is large, the crushing amount of the seal component may become large. Thereby, when the lid is opened, the seal component may remain crushed. Thus, it may become difficult to use the same seal component when covering the lid again. On the other hand, if the torque for screwing the screw components is small, the crushing amount may become smaller. In this case, it may be easier for the seal component to recover to its original state. Therefore, it may be possible to use the same seal component again when covering the lid. By making torque at the time of screwing smaller, it may be possible to prevent the second accommodation unit (3) from decreasing its sealing performance due to the repetitive uncovering and covering of the second lid (5).

In the above-mentioned display device, at the plurality of places in the first lid (62) of the first accommodation unit (63), the penetration holes (621a)-(621z) are formed. In the first concave portion (61) screw components are screwed, penetrating the respective penetration holes (621) chosen from the penetration holes (621a)-(621z). Therefore, according to the usage of the display device, the number of the screw components used for connecting the first concave portion (61) and the first lid (62) can be changed. As a result, the distance between the adjacent screw components can also be adjusted.

At plurality of places in the second lid (5) of the second accommodation unit (3), penetration holes (404a)-(404n) are formed. In the second concave portion (4) screw components are screwed penetrating the respective penetration holes (404) chosen from the penetration holes (404a)-(404n). Therefore, according to the usage of the display device, the number of the screw components used for connecting the second concave portion (4) and the second lid (5) can be changed. As a result, the distance between the adjacent screw components can also be adjusted.

Therefore, between the display devices having different usage, the first lid (62) and the second lid (5) can be used commonly.

In the above-described display device, by opening the second lid (5), the plug (71) of the power cord (7) can be inserted in the socket (6). Here, the socket (6) is provided facing downward. Thus, the plug (71) inserted in the socket (6) protrudes downwards from the socket (6) as shown in FIG. 9, and the power cord (7) extends downward from the socket (6). Thereby, when installing the display device facing its back side to the wall, the display device may require smaller space (room) in the back side of the display device, compared to the display device in which the plug protrudes backwards from the socket (6) toward the wall.

After inserting the plug (71) in the socket (6), by closing the second lid (5) while fitting the power cord (7) to the pair of the grooves (31) and (32), the cord (7) stretching downward from the socket (6) can be drawn downward from inside the second accommodation unit (3) to the outside of the cabinet (2) through the penetrating hole (30). Similarly, the cable connected to the connector (60) is drawn downward from inside the second accommodation unit (3) to the outside of the cabinet (2) through the hole (30). Thereby, the display device may require small space in the back side of the display device when installing the display device facing its back side to the wall.

By closing the second lid (5) while fitting the power cord (7) and the cable to the pair of the grooves (31) and (32), the cord (7) and the cable may be sandwiched without a gap by the sealing components (81) and (82) as shown in FIG. 9.

Thus, intrusion of water or dust from the hole (30) may be prevented by the sealing components (81) and (82) when the cord (7) and/or the cable are penetrated through the hole (30).

Thus, according to the above-described display device, the socket (6), the plug (71), and the connector (60) inside the second accommodation unit (3) may be prevented from exposure to the water and/or dust even when the display device is installed outdoor. In other words, the second accommodation unit (3) formed by the second concave portion (4) and the second lid (5) has a sealed structure which may prevent or reduce the water and/or dust from intruding inside from the hole (30) or from the jointing surface. Furthermore, in the above-described display device, the width of the third groove (35) may be made smaller for the portion in the upper side, left side, and/or right side of the opening (40) of the second concave portion (4) compared to the width of the second groove (33) in the lower side of the opening (40) of the second concave portion (4). This can improve the waterproofing or dust-proofing structure of the second accommodation unit (3).

Other implementations are contemplated. For example, when forming the first accommodation part (63) by connecting the first lid (62) with the first concave portion (61), the screw components may be penetrated in other penetration holes (621) compared to the example described above. According to the frequency of the removal of the first lid (62), required sealing performance for the first accommodation unit (63), or the usage of the display device, penetrating holes (621) to which the screw components are penetrated can be selected. This is the same for the case when forming the second accommodation unit (3) by connecting the second lid (5) with the second concave portion (4).

With respect to the above-described display device, the third groove (35) may be provided on the jointing surface of second lid (5) instead of on the jointing surface of the second concave portion (4). The penetrating hole (30) may be arranged only in one place.

In the above-described display device, the penetrating hole (30) may be provided on the lower wall of the second accommodation unit (3). In another example, the hole (30) may be provided on the other inner walls of the second accommodation unit (3), (the upper wall, left side wall, or right side wall).

In such case, the hole (30) is formed outside the area intersecting the back wall (22) of the cabinet (2). Thereby, the power cord (7) or the cable can be drawn outside from the second accommodating unit (3) not only downward but also upward, leftward or rightward depending on how the display device is installed. Thereby, optimum wiring of the cord or the cable depending on the installing place of the display device may be realized. Further, the above-described structures may be applied not only to the display device having the LCD panel (1), but also to the display device having a plasma display panel, OLED display panel, or Electro-Luminescence panels etc.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A display apparatus comprising:
a display panel;
a cabinet configured to accommodate the display panel;
a first concave portion defining a first opening in a back wall of the cabinet;
a first lid configured to cover the first opening;
a second concave portion defining a second opening in the back wall of the cabinet;
a second lid configured to cover the second opening;
a plurality of first fastening elements configured to connect the first concave portion and the first lid; and
a plurality of second fastening elements configured to connect the second concave portion and the second lid, wherein
a distance between adjacent first fastening elements and a distance between adjacent second fastening elements are different, and
the second concave portion is provided on the first lid.

* * * * *